United States Patent [19]

Woychik et al.

[11] Patent Number: 5,644,475
[45] Date of Patent: Jul. 1, 1997

[54] SOLDER MASK FOR A FINGER CONNECTOR ON A SINGLE IN-LINE PACKAGE MODULE

[75] Inventors: Gerard A. Woychik, Waukesha, Wis.; John C. Mather, Cedar Rapids, Iowa

[73] Assignee: Allen-Bradley Company, Inc., Milwaukee, Wis.

[21] Appl. No.: 419,792

[22] Filed: Apr. 11, 1995

Related U.S. Application Data

[63] Continuation-in-part of Ser. No. 316,667, Sep. 30, 1994, Pat. No. 5,484,965.

[51] Int. Cl.$^6$ ........................................... H05K 1/02
[52] U.S. Cl. .................. 361/767; 174/261; 228/179.1; 29/840
[58] Field of Search ................... 174/261; 361/767, 361/768, 771, 777, 779, 784, 808; 257/737, 739; 29/840, 843, 860; 439/59, 65, 83; 228/179.1, 180.1, 180.21, 180.22

[56] References Cited

U.S. PATENT DOCUMENTS

| | | |
|---|---|---|
| 3,610,811 | 10/1971 | O'Keefe .................... 174/68.5 |
| 3,851,223 | 11/1974 | Yonezuka et al. .......... 317/101 CC |
| 3,993,936 | 11/1976 | Meade et al. . |
| 4,767,892 | 8/1988 | Koban .................... 174/68.5 |
| 5,031,072 | 7/1991 | Malhi et al. .............. 361/729 |
| 5,329,068 | 7/1994 | Hirata et al. ............. 174/261 |
| 5,343,366 | 8/1994 | Cipolla et al. ............ 361/785 |
| 5,373,113 | 12/1994 | Ishii ...................... 174/261 |
| 5,478,973 | 12/1995 | Yoon et al. ............... 174/260 |

FOREIGN PATENT DOCUMENTS

2442570 7/1980 France .................... 361/803

*Primary Examiner*—Laura Thomas
*Attorney, Agent, or Firm*—Joseph N. Ziebert; John M. Miller; John J. Horn

[57] ABSTRACT

A solder resist pattern for a single in-line package (SIP) finger connector, or other interface member includes small solder resist features spaced closely together. The features can be circular, square, diamond-shaped, star-shaped, or other geometry and preferably are placed on finger connectors in a photo-imaging process. The pattern includes meniscus channels which are narrow enough to prevent solder from adhering to the finger connectors. The surface area of the features is small enough so that the pattern can be easily removed by a low impact or non-contact operation. Preferably, the pattern is removed by a hot air solder knife after the board is subjected to a solder wave.

20 Claims, 7 Drawing Sheets

SOLDER MASK FOR A FINGER CONNECTOR ON A SINGLE IN-LINE PACKAGE MODULE

CROSS-REFERENCE TO RELATED APPLICATIONS

This application is a continuation-in-part of U.S. application Ser. No. 08/316,667, entitled "Circuit Board Adapted to Receive a Single In-line Package Module", filed on Sep. 30, 1994, now U.S. Pat. No. 5,484,965.

FIELD OF THE INVENTION

The present invention relates to a circuit board, and more particularly to a solder mask, solder resist, or cover for finger connectors or contact areas on a circuit board or single in-line package module.

BACKGROUND OF THE INVENTION

Circuit boards (e.g., motherboards) often contain single in-line package (SIP) modules such as circuit boards, electrical devices, resistors, capacitors, or other electronic equipment. The SIP modules include connectors, fingers, leads, contacts, pins, or other interface members arranged in a single line on an edge of the board. Typically, the connectors or fingers are included on both sides of the board. The modules are mounted to the motherboard in a perpendicular fashion to maximize the number of devices, components, circuit boards, or equipment attached to the motherboard.

In general, SIP modules or other circuit boards are manufactured by etching a copper layer or layers on an insulated substrate to form a conductive pattern including trace lines and contact pads (e.g., footprints, finger connectors, or other features) for electrical devices or interconnection systems. The trace lines electrically connect the contact pads to various other contact pads on the circuit board. SIP modules or other circuit boards typically include contact pads such as finger connectors which serve as interfaces between the motherboard or other circuit board and the module. The finger connectors or other connecting features are typically located proximate the edge of the module and allow the module to physically and electrically engage the motherboard.

After the module is etched, a solder mask is applied to the board. The solder mask is applied to the circuit board in a photo-imaged solder mask pattern. The solder mask pattern prevents solder in subsequent manufacturing steps from attaching to portions of the board covered by the solder mask pattern. The solder mask pattern is generally applied in a photo-sensitive process in which the solder mask is screened on or curtain coated to cover the entire circuit board and exposed to light (e.g., infrared light) through a reverse-imaged photographic film artwork arranged according to the solder mask pattern. This solder mask is cured to the board in the solder mask pattern after exposure to light through the photographic film artwork. After curing, the solder mask cannot be easily removed from the board without deforming or otherwise destroying portions of the circuit board. Examples of such solder mask or solder resist are Probimer 52 M™ manufactured by Cyba-Giegy, 8200™ manufactured by Dexter-Hysol, two-part epoxy solder resist, or other types of solder resist.

After the solder mask is cured in the solder mask pattern, unwanted solder mask covering conductive areas that accept electrical components (e.g., solder mask outside the solder mask pattern) is taken off by plunging the board in an aqueous bath of solder mask remover, thereby leaving the solder mask pattern on the board. After the solder mask pattern is applied to the board, electrical devices are placed on the various contact pads, features or connection areas on the board. The board is exposed to a solder wave to physically and electrically attach (e.g., solder) the electrical devices to the board. Alternatively, the devices can be soldered to the board by infrared (IR) reflow soldering or vapor phase soldering. After the electrical devices are soldered to the board, the board or module is attached to the motherboard or other circuit board.

The fingers or other connecting features are utilized to physically and/or electrically interface the motherboard to the module. Module interconnection systems (e.g., connectors, header assemblies, connection features such as those described in U.S. patent application Ser. No. 08/316,667 which is the parent of this application, slot edge connectors, card connectors, printed circuit (PC) board connectors, or other hardware) physically engage the fingers to support the module at a 90° angle with respect to the board. For example, the edge of a module such as a video card including finger connectors can be inserted into a slot edge connector on the motherboard of a personal computer. The module is held in the slot edge connector by a friction fit between the edge of the video card and the slot edge connector. Alternatively, the edge of a module can be inserted through a hole in the motherboard, and the fingers of the module can be soldered to other fingers on the motherboard by a wave soldering technique as described in U.S. patent application Ser. No. 08/316,667.

Fingers or other connecting features for interfacing boards together are generally made from metal conductors such as tin lead solder (PbSn), palladium nickel (PdNi), gold plate (Au), an organic coating (e.g., ENTEK™), electroless NiAu over Cu, Bismuth (Bi) over Cu, or other conductive material. The finger connectors typically must be manually taped with polyamide film tape or high temperature covering to prevent the solder from the solder wave or other soldering technique utilized to attach the electrical devices to the module from accumulating on the finger connectors. If solder attaches to the finger connectors, the finger connectors cannot properly engage, interference fit, or otherwise interface with the interconnection system on the motherboard. Additionally, if the solder wave touches finger connectors made of gold plate, the gold from the finger connectors can mix into the solder bath and spoil the entire solder bath associated with the solder wave. After soldering, the tape must be manually removed before the module is attached to the motherboard. Such manual taping steps are expensive, time consuming and add to the cost of assembling the module or other circuit board.

Heretofore, solder mask has not been applied to the finger connectors to prevent the solder from attaching to the finger connectors because the solder mask becomes essentially permanently attached to the fingers, thereby preventing a suitable physical and electrical engagement with the interconnection system. Thus, there is a need for contact areas or finger connectors for a motherboard, SIP module, or other circuit board which do not need to be manually taped. Further, there is a need for a solder mask pattern which can be removably applied to the finger connectors and yet prevent solder from attaching to the finger connectors. Further still, there is a need for a solder masking technique for the finger connectors which is low cost, does not add extra manufacturing steps, allows the module to be efficiently connected to the motherboard, reliably protects the finger connectors, and utilizes conventional solder mask materials.

SUMMARY OF THE INVENTION

The present invention relates to a method of manufacturing a circuit board. The method includes steps of depositing a solder mask on the circuit board, soldering the circuit board, and removing the solder mask from the circuit board with a low impact removal technique. The solder mask covers the contact feature in a pattern. The pattern prevents solder from adhering to the portion of the contact area.

The present invention also relates to a contact area for a circuit board. The contact area is manufactured according to an advantageous method. The advantageous method includes steps of providing the contact area on a surface of the circuit board, providing a solder mask over the contact area in a pattern, the pattern being configured to prevent solder from adhering to the contact area and yet be removed by a low impact operation, and stripping the pattern of solder mask by the non-contact operation.

The present invention also relates to an improved finger connector for a first circuit board. The finger connector interfaces a first circuit board to a second circuit board. The finger connector is improved by applying a solder mask in a pattern over the finger connector. The pattern of the solder mask is configured to prevent solder from adhering to the finger connector and to be removable from the finger connector without deforming the finger connector.

In one aspect of the present invention, the fingers are masked with a pattern of solder mask before attaching electrical devices to the circuit board. The pattern includes small lines, squares, circles, diamonds, or rectangles of solder resist spaced closely together. Preferably, the solder mask is removed by a hot air knife, pneumatic tool, brush, suction member, or a non-contact instrument after the electrical devices are attached.

In another aspect of the present invention, the pattern includes solder mask features having an area less than 25 millinches (mils) squared and a distance between neighboring features of less than 2 mils. The features are typically 0.5 mils in height from the surface of the circuit board. The distance between features creates meniscus channels which prevent the solder from attaching to the board, and the small area allows the solder mask to be easily removed.

The solder mask is advantageously removed by a non-contact, low impact technique which provides a light mechanical force. The removal of the solder resist is preferably after the board is exposed to a solder wave or other soldering technique. The solder resist or mask can be a photo-imageable type solder mask.

BRIEF DESCRIPTION OF THE DRAWINGS

Preferred embodiments of the invention will hereinafter be described in conjunction with the appended drawings, wherein like numerals denote like elements, and.

DETAILED DESCRIPTION OF PREFERRED EXEMPLARY EMBODIMENTS

Figure 1:
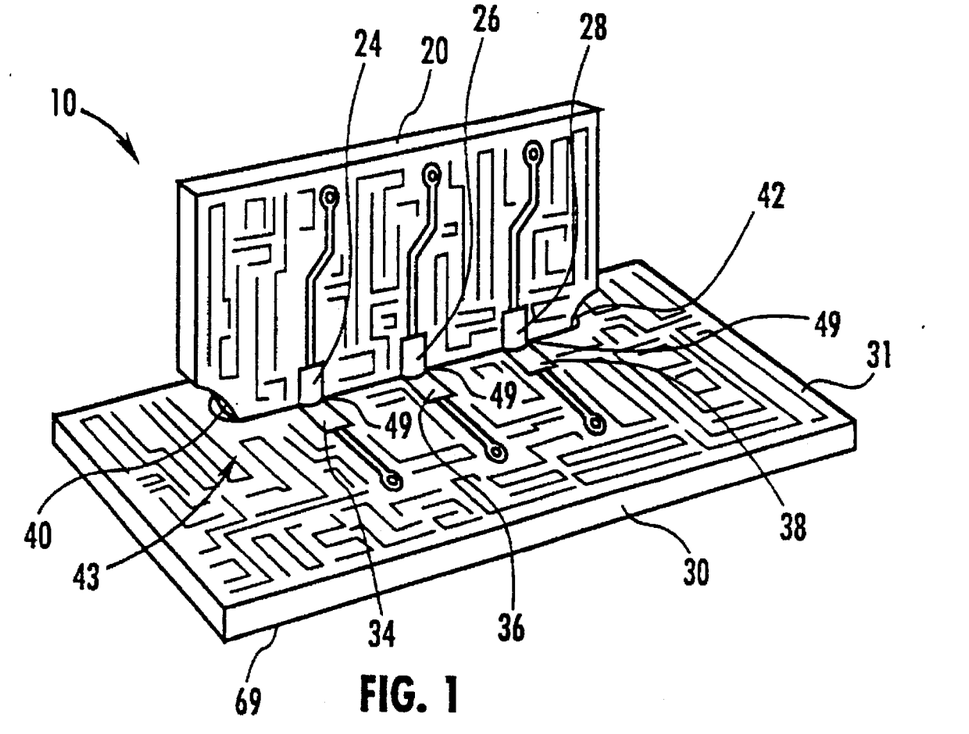
FIG. 1 is a perspective view of an SIP module and motherboard in accordance with a preferred exemplary embodiment of the present invention.

FIG. 1 shows a circuit board system 10 including a SIP module 20 mounted in a perpendicular fashion on a parent board or motherboard 30. Circuit board system 10 may be utilized in a variety of electrical and electronic environments to perform numerous applications. Circuit board system 10 may include a board 30 configured to support a large number of modules 20.

Module 20 is mounted to a slot 40 in a mounting area 43 of motherboard 30. Finger connectors 24, 26 and 28 are in electrical communication with finger connectors 34, 36 and 38 on a top surface 31, respectively, when module 20 engages board 30. Module 20 is supported by an interior wall 42 of slot 40. Slot 40 preferably extends from top surface 31 to a bottom surface 69. Interior wall 42 includes hemicylinders 49 (discussed in more detail below) physically and electrically coupled to connectors 34, 36 and 38.

System 10 advantageously transfers the stresses on module 20 into motherboard 30 without weakening the coupling between module 20 and board 30 (e.g., the solder joints in slot 40). System 10 utilizes the inherent strength associated with board 30 to provide a stable mounting for module 20. Slot 40 may be designed to provide a size-on-size fit, interference fit, or strain relief fit for module 20.

Figure 2:
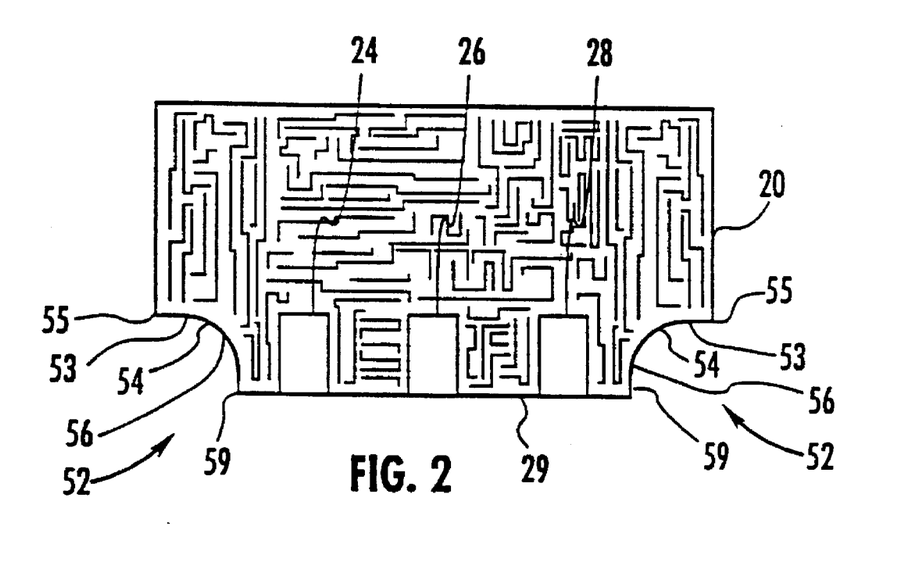
FIG. 2 is a side view of the SIP module illustrated in FIG. 1.

With reference to FIG. 2, SIP module 20 is a structure such as a printed circuit board including electrical components and associated circuitry. Alternatively, module 20 may be a resistor package, electronics device, integrated circuit, or other electrical arrangement. Module 20 allows a large number of components to be housed on a relatively small area of board 30. Module 20 includes knee regions 52 proximate an edge 29. Knee regions 52 structurally support module 20 in slot 40, as is discussed below with reference to FIGS. 3–5.

Figure 3:
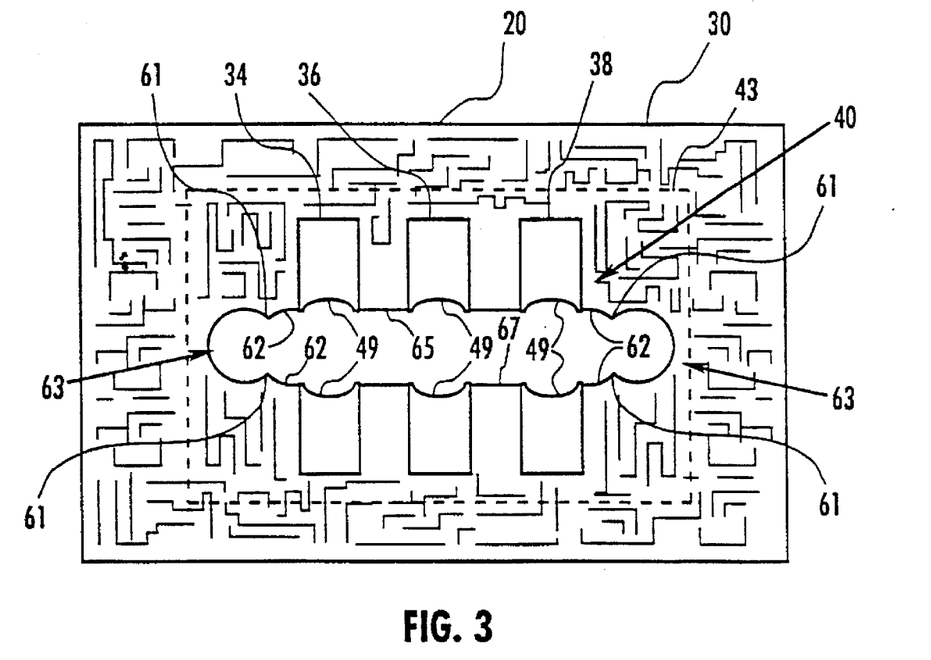
FIG. 3 is a top view of the motherboard illustrated in FIG. 1.

With reference to FIG. 3, motherboard 30 is a printed wire circuit or pc board. Motherboard 30 may be a single layer or multi-layer circuit board. Board 30 may include numerous mounting areas such as mounting area 43 and may include connectors similar to connectors 34, 36 and 38 on bottom surface 69 of board 30.

Board 30 includes mounting area 43 having a generally oval shaped slot 40. Slot 40 is a partially plated slot defined by interior wall 42. Interior wall 42 includes hemicylinders 49 about the periphery of slot 40. Hemicylinders 49 are in electrical communication with connectors 34, 36 and 38. Hemicylinders 49 provide a stable electrical contact and physical mounting for module 20 in slot 40 of board 30.

Hemicylinders 49 are advantageously fabricated by providing features (e.g., drilling holes for pins of standard integrated circuit packages) on board 30. The holes are plated, having a hollow conductive via or a metal barrel which extends from top surface 31 to bottom surface 69 of board 30. When board 30 is cut, milled, or otherwise configured to form slot 40, the holes are sliced (e.g., the edges of slot 40 cross the plated holes), thereby forming hemicylinders 49. Thus, pc board fabrication techniques can be utilized to efficiently produce the difficult to manufacture hemicylinders 49 about the periphery of slot 40.

Slot 40 is advantageously shaped to allow module 20 to be easily attached to board 30. Slot 40 may be an elongated oval or other aperture for receiving module 20. Preferably, slot 40 is configured for an interference fit with knee regions 52 of module 20 (FIG. 2). Slot 40 includes arcuate regions 63 and arcuate regions 62, which define points 61.

Preferably, points 61 engage and deform against regions 56 of module 20 as edge 29 of module 20 is pushed through slot 40. Module 20 is advantageously positioned with connectors 34, 36, and 38 aligning with connectors 24, 26, and 28, respectively, and centered within slot 40 as points 61 are deformed. Knee regions 52 should be positioned in the center of arcuate regions 63 once module 20 engages slot 40. The interference fit provided by points 61 holds module 20 captive as it is attached and yet distances module 20 away from interior wall 42 to allow solder wicking. Solder wicking allows a stable physical and electrical connection to be formed between module 20 and board 30. The configuration of system 10 having slot 40 allows module 20 to be wave soldered, eutechtic soldered, reflow soldered or otherwise attached to board 30 in an economical fashion.

Motherboard 30 may be manufactured utilizing economical circuit board fabrication techniques. With reference to FIG. 3, motherboard 30 is manufactured according to the following method. Generally, features such as the holes associated with hemicylinders 49 or other mounting areas are provided on board 30. The holes are plated with copper. Slot 40 for mounting area 43 is then cut into board 30.

After cutting, slot 40 is etched to provide a smooth or clean interior wall 42. Etching slot 40 removes portions of the plated holes associated with hemicylinders 49 or connectors 34, 36, and 38 which may have been partially removed or altered during the cutting of slot 40. A clean interior wall 42 allows module 20 to be easily inserted into slot 40 and attached to motherboard 30. Also, a clean interior wall 42 ensures a secure electrical contact between connectors 24, 26 and 28 and connectors 34, 36 and 38, respectively.

The fabrication of board 30 including mounting area 43 is described as follows more particularly explaining each process step. The holes required for hemicylinders 49 are drilled into board 30 about the periphery of slot 40 which has not yet been milled.

Board 30 is copper plated according to an electroless copper plating technique. Electroless copper plating techniques include chemically depositing copper across board 30. Interior walls of the holes associated with hemicylinders 49, as well as other apertures, are coated with a copper layer in this step forming conducting vias or copper barrels. Next, board 30 is copper plated with an electrolytic panel plating technique, thereby making the copper layer thicker.

A photoresist is applied to board 30 in a pattern representative of the connections and electrical devices which will be provided on board 30. The photoresist preferably defines footprints, contacts for mounting area 43 (e.g., finger connectors 34, 36, and 38), and copper conductors on board 30. The photoresist prevents additional plating of copper on board 30 where the photoresist is present. Next, board 30 is further plated with an electrolytic copper panel plating technique, followed by a copper pattern plating technique, and a tin lead (solder) pattern plating technique. The tin lead plating acts as an etch resist.

After the tin lead is placed on board 30, board 30 is milled to form slot 40. The milling of slot 40 on board 30 leaves burrs or extra copper material in slot 40. Generally, the mill cutter, drill, or router is not able to make a clean cut through the plated holes associated with hemicylinders 49. The cutter tends to push or fold an edge of the plated holes associated with hemicylinders 49 into slot 40. Also, the cutter tends to separate the plated holes from the dielectric material associated with board 30. Extraneous copper in slot 40 prevents a proper fit for module 20 against interior wall 42 and interferes with proper electrical communication between module 20 and board 30. To alleviate the problems associated with the extraneous copper, slot 40 is etched in a step described below.

After slot 40 is formed, the photoresist is then stripped from board 30. Next, board 30 is etched to reveal the pattern which was provided in the photoresist step. The etching further removes most of the extra copper and burrs which have been pushed into slot 40. Board 30 is then coated with the solder mask and reflow soldered with tin lead conductive material such as solder. Reflow soldering may be accomplished by plunging board 30 in a bath of solder and either hot air solder leveling (HASL) the tin lead solder or placing board 30 in an oven and heating beyond the eutectic temperature. Reflow soldering ensures an electrically conductive mounting area 43 (e.g. finger connectors 34, 36 and 38 and hemicylinders 49). Slot 40 can be tented by providing a thin layer of solder mask.

In another embodiment, board 30 is manufactured according to similar steps. However, the milling step is preferably performed after the stripping the photoresist step instead of after the panel plating step as described above. Board 30 is etched after the milling step to remove the excess copper in slot 40 to provide clean interior walls 42 for a secure fit and reliable electric contact for module 20.

Exemplary embodiments of the method and apparatus of the present invention related to the advantageous solder mask pattern are discussed with reference to FIGS. 4–8 below. The advantageous solder mask pattern may be applied to any contact area, finger connector, footprint, feature or other metal region on a circuit board. The solder mask pattern is suitable for any finger connector usable with edge connectors, plugs, or other interconnection systems. The pattern may be utilized on any contact area having a portion which should be protected from wave or reflow solder but cannot be permanently coated with solder mask.

Figure 4:
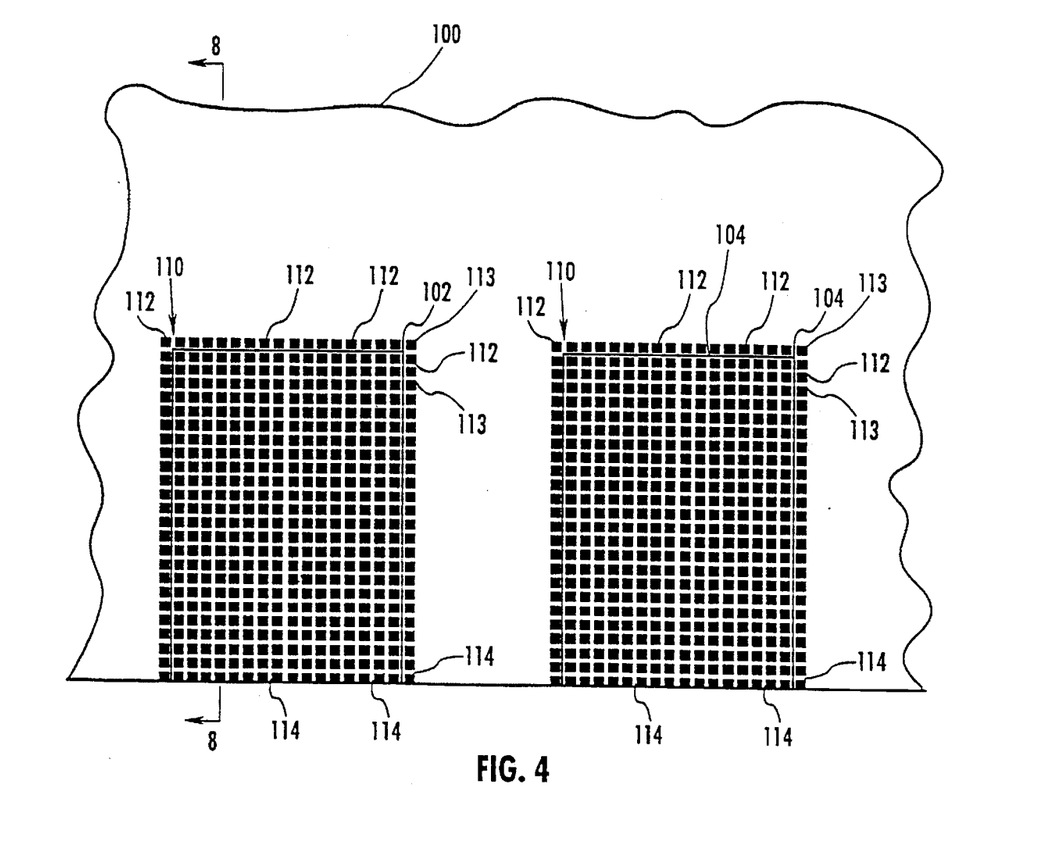
FIG. 4 is a top view of a pattern of square-shaped solder resist features on a finger connector for the module illustrated in FIG. 2 or the motherboard illustrated in FIG. 3 in accordance with a first exemplary embodiment of the present invention.

With reference to FIG. 4, a board 100 includes a finger connector 102 and a finger connector 104. Board 100 can be a motherboard similar to board 30, a module similar to module 20, a SIMM module, a SIP module, video card, or other circuit board. Finger connectors 102 and 104 are similar to finger connectors 24, 26 and 28 (FIG. 1) and finger connectors 34, 36 and 38 (FIG. 1). For purposes of explanation only, a pattern 110 of photoresist features 112 covers the entire surface of fingers 102 and 104.

Solder resist features 112 are square-shaped features having 3–5 mil sides and being distanced apart from each other less than 2.5 mils. Features 112 may be a variety of shapes including triangular, rectangular, pentangular, hexagon-shaped, or combinations of shapes. Alternatively, features 112 can be touching at corners 113 and have arcuate sides. Preferably, features 112 are spaced apart from each other from 1 to 2 mils or less. The spacing of features 112 apart from each other forms meniscus channels 114 between features 112.

Meniscus channels 114 are narrow enough to prevent solder from contacting fingers 102 or 104. Meniscus channels 114 are dimensioned so that the surface tension of the solder prevents the solder from overcoming the barrier formed by pattern 110 and contacting finger connectors 102 and 104. The dimension of meniscus channels may be changed for solder materials having different surface tensions. For example, meniscus channels 114 having a distance of 1–2 mils are narrow enough to prevent wicking for 62% Sn, 36% Pb, 2% Ag solder or 63% Sn, 37% Pb solder.

Features 112 have a surface area small enough so that pattern 110 and features 112 may be removed by a low impact operation. For example, a low impact operation allows pattern 110 to be removed without subjecting finger connectors 102 and 104 to mechanical stresses. A low impact, non-contact operation for removing pattern 110 includes removing pattern 110 with a hot air knife (not shown) after board 100 is subjected to a solder wave. The use of the hot air knife is often an existing manufacturing step in the building of circuit board 100 such as when circuit board 100 is hot air solder leveled. Alternatively, solder mask 110 may be removed by other low impact operations such as a brush operation, pneumatic operation, rinsing operation, suction operation, or light scraping operation.

The small area associated with each of features 112 prevents feature 112 from permanently adhering to board 100 or finger connectors 102 and 104. Features 112 having areas less than 25 mils squared can be advantageously removed by a low impact operation because there is not enough surface area associated with features 112 to permanently adhere to board 100. Features 112 generally have an area between 9 and 25 mils squared.

Features 112 can also be designed to have corners (not shown) or extensions (not shown) so that less surface area of feature 112 is centered within feature 112. Such a geometric orientation allows features 112 to be more easily removed by the low impact operation. For example, features 112 are more easily removed if the hot air knife is able to engage a corner or extension 113 of feature 112 and effectively peel off feature 112 from board 100. Preferably, the hot air knife engages features 112 at a 45° angle so that corners 113 of features 112 are lifted up by the low impact operation.

Figure 8:
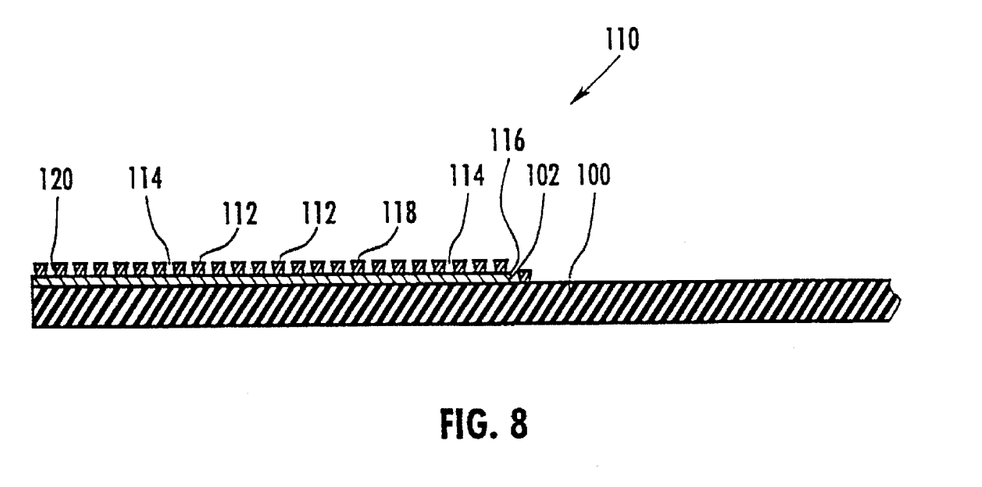
FIG. 8 is a cross-sectional view of the pattern on the finger connector illustrated in FIG. 4.

With reference to FIG. 8, a cross-sectional view of board 100 having pattern 110 on finger connector 102 is shown. Features 112 typically have a height from a top surface 116 of finger connector 102 to a top surface 118 of features 112 of 0.25 to 0.5 mils. Meniscus channels 114 are preferably 1–2 mils wide from top surface 118 to top surface 118 of features 112. Features 112 inherently have a larger surface area on top surface 118 than on bottom surface 120 which contacts top surface 116. This cut-away geometry advantageously allows features 112 to be closer together at top surface 118 than at bottom surface 120.

Such a configuration allows meniscus channels 114 to be relatively narrow while features 112 are held to finger connector 102 by a relatively small area at bottom surface 120. The relatively small area at bottom surface 120 (e.g., 20.5 mils squared for a feature 112 having an area for top surface 118 of 25 mils squared) prevents large adhesion force between surface 120 and surface 116. Typically, the side dimensions of bottom surface 120 are 30–50% of the thickness of the solder resist smaller than the side dimensions of top surface 118. For example, for solder mask having a thickness of 0.5 mils, the side dimension of top surface 118 is 0.25 mils larger than the side dimensions of bottom surface 120. Therefore, meniscus channels are 0.25 mils larger at bottom surface 120 than at top surface 118.

Preferably, the solder mask material for features 112 is Probimer 52 M™ manufactured by Cyba-Giegy, 8200™ manufactured by Dexter-Hysol, two-part epoxy solder mask, or other solder resist. Features 112 of solder mask are placed on board 100 via a photo-sensitive process utilizing a reverse-imaged photographic film artwork having pattern 110. The solder mask is curtain coated or screened on board 100 and cured to form pattern 110 of features 112 through the film artwork. Pattern 110 may be configured to leave particular portions of finger connectors 102 or 104 exposed to solder so that small amounts of solder build on finger connectors 102 and 104 to form more stable solder attachments, or interference fits with interconnection systems.

Figure 5:
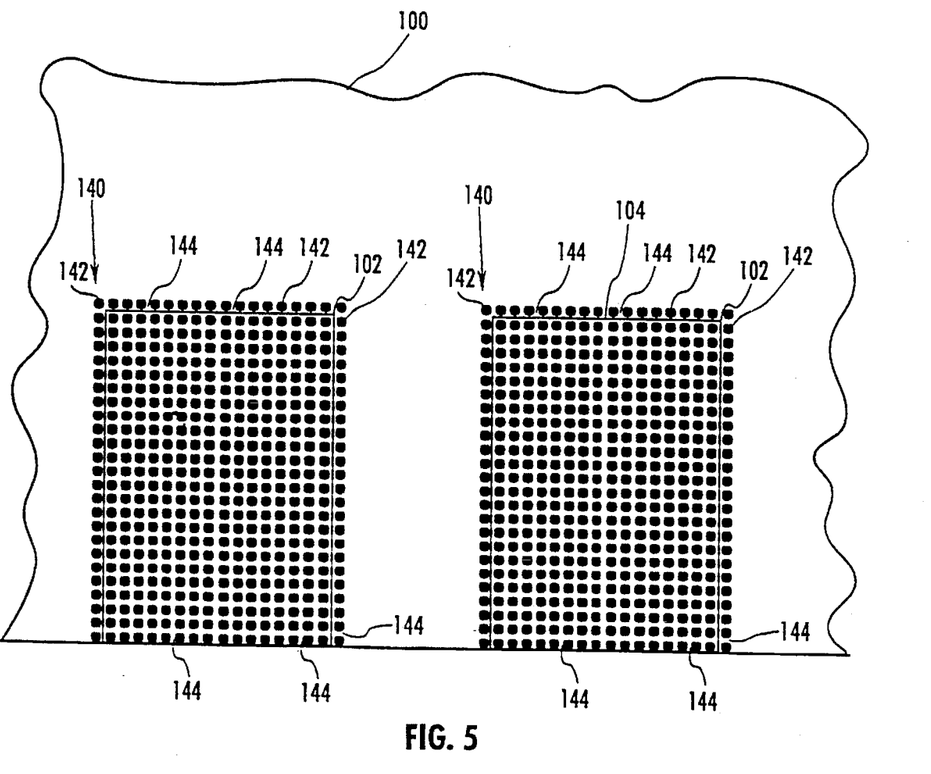
FIG. 5 is a top view of a pattern of circular-shaped solder resist features on a finger connector for the module illustrated in FIG. 2 or the motherboard illustrated in FIG. 3 in accordance with a second preferred exemplary embodiment of the present invention.

With reference to FIG. 5, circuit board 100 includes a pattern 140 of circular-shaped features 142 of photoresist. Pattern 140 is similar to pattern 110 illustrated in FIG. 4 wherein like designators denote like elements. Pattern 140 includes meniscus channels 144 spaced 1 to 2 mils apart. Alternatively, features 142 can share a common tangent point with neighboring features. Circular-shaped features 142 preferably have a radius of less than 2.5 mils.

Figure 6:
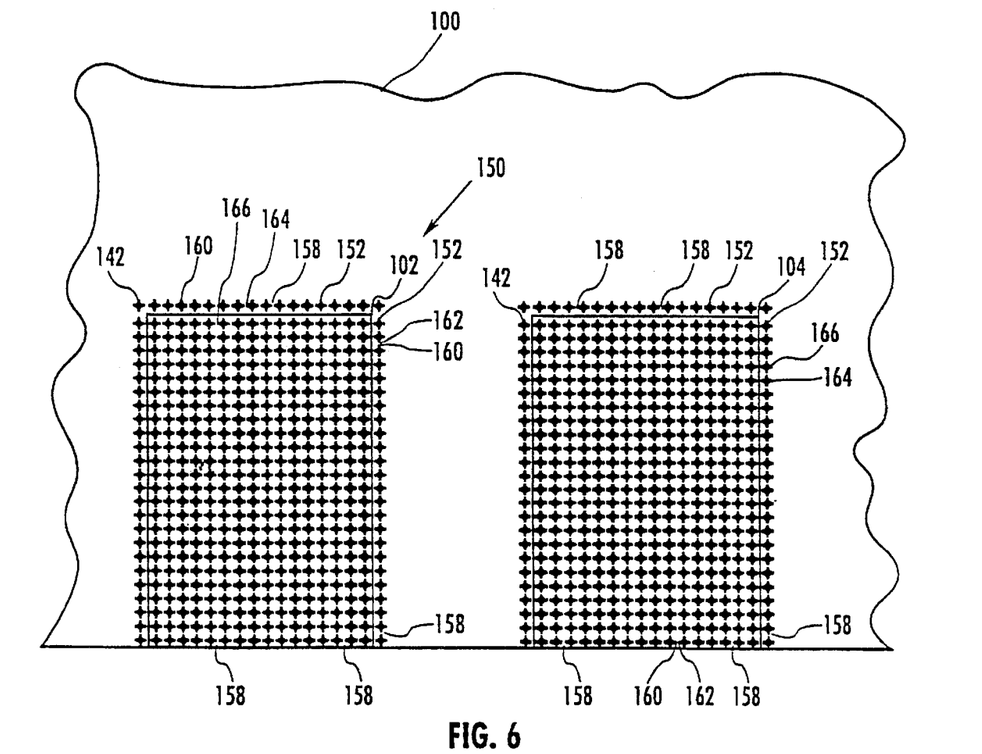
FIG. 6 is a top view of a pattern of star-shaped solder resist features on a finger connector for the module illustrated in FIG. 2 or the motherboard illustrated in FIG. 3 in accordance with a third exemplary embodiment of the present invention.

With reference to FIG. 6, a pattern 150 of star-shaped features 152 is coated on finger connectors 102 and 104. Pattern 150 is substantially similar to pattern 110; however, features 152 are diamond or star-shaped. Meniscus channels 158 are formed on pattern 150 and are less than 1–2 mils apart from point 160 to point 162 and are 4–7 mils apart from point 164 to point 166. Pattern 150 is particularly advantageous because the surface area is reduced toward the middle of each feature 152, thereby making features 152 easier to remove. Alternatively, features 152 may touch or almost touch at points 160 and 162.

Figure 7:
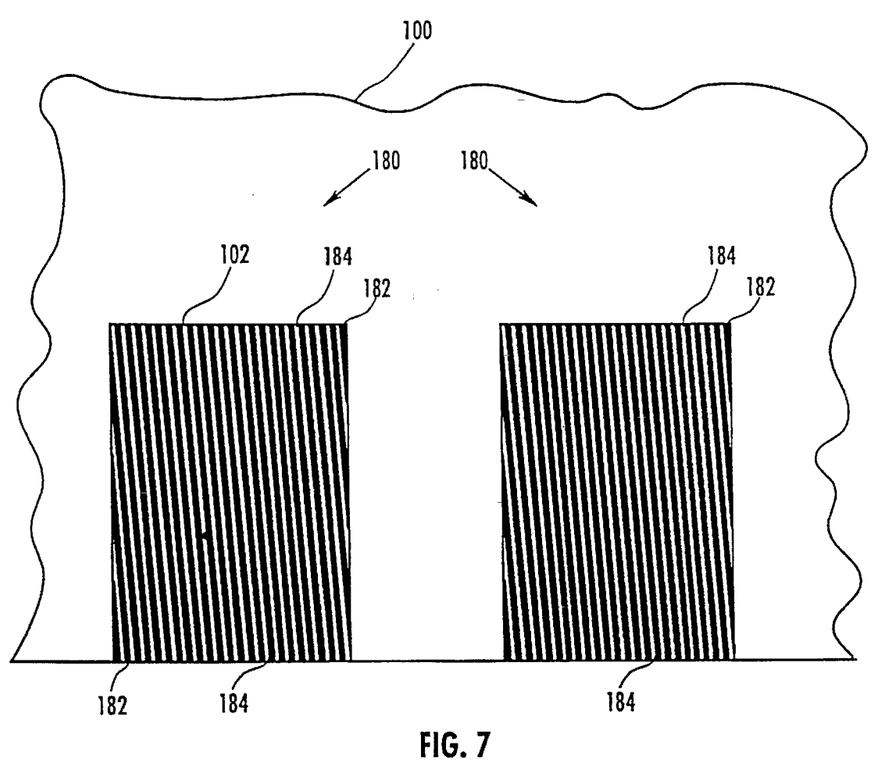
FIG. 7 is a top view of a pattern of lines of solder resist on a finger connector for the module illustrated in FIG. 2 or the motherboard illustrated in FIG. 3 in accordance with a fourth exemplary embodiment of the present invention.

With reference to FIG. 7, finger connectors 102 and 104 are coated with a pattern 180 of solder resist lines 182. Solder resist lines 182 are preferably disposed at an angle with respect to a vertical axis of connector 102. Board 10 is preferably subjected to a solder wave in a perpendicular or parallel fashion to the central axis of lines 182. Lines 182 are preferably 2–3 mils wide and are separated from each other by meniscus channels 184 having a width of 1–2 mils.

Lines 182 are easily removed because of the narrow width of line 182. Pattern 180 is particularly advantageous for allowing some solder to attach to connector 102 for providing stronger solder wicking and interference fitting for interconnection systems such as for the arrangement of system 10 (FIG. 1). Preferably, the hot air knife (not shown) is applied perpendicular to lines 182 so that lines 182 are more easily peeled off. In SnPb finger configurations, pattern 180 can be configured to allow a small amount of solder to fall between lines 182, thereby leaving small amounts of solder on finger connectors 102 and 104 for future soldering operations. The small amounts of solder arranged in columns can advantageously draw up solder in subsequent operations.

The manufacturing of pattern 110 is discussed below with reference to FIG. 4. However, the description of the manufacture of pattern 110 can apply to the manufacture of pattern 140 (FIG. 5), pattern 150 (FIG. 6) or pattern 180 (FIG. 7). Pattern 110 is advantageously manufactured utilizing economical circuit board fabrication techniques.

After board 100 is etched and finger connectors 102 and 104 are formed, solder resist is curtain coated or screen coated to cover top surface 116 of board 100. After the solder mask is applied, the solder mask is cured in a predetermined pattern (e.g., a solder mask pattern) in accordance with a film artwork. The solder resist may be cured by providing IR light or other light through the artwork to the circuit board in the form of the predetermined pattern. Preferably, the predetermined pattern includes pattern 110 situated over finger connectors 102 and 104. Alternatively, a pattern such as pattern 110 can be applied to any contact area, connector, or feature to protect the contact area or feature from solder or to allow only a small amount of solder to affix to the contact area or feature.

After the solder mask is cured, the solder mask is exposed to a solder mask remover and uncured solder mask is taken off board 100, thereby leaving the predetermined pattern including pattern 110 over finger connectors 102 and 104. After the solder mask is applied, electrical devices are placed on contact areas, pinholes, footprints, or other features on board 100. Then, the electrical devices are soldered to board 100. Preferably, the electrical interface between module 20 and board 30 are soldered by a wave soldering technique. Alternatively, the electrical devices may be soldered by a reflow soldering technique, or other soldering technique.

After board 100 is soldered, board 100 is typically subjected to a hot air knife to remove excess solder and additionally remove pattern 110. Subjecting board 100 to the solder wave assists the removal of pattern 110 because the heat associated with the solder wave weakens the adhesion between board 100 and pattern 110. Thus, pattern 110 can be removed by a low impact operation. Alternatively, pattern 110 can be removed by a brushing, pneumatic, suction, or scraping operation.

The dimensions of the features, patterns, finger connectors, and circuit boards may be advantageously optimized for best reliability. For example, other arcuate shapes, mixed shapes or straight edge shapes can be utilized for the pattern of solder resist. Further, the pattern may be adjusted to allow portions of the finger connector to receive solder. The various dimensions discussed with reference to FIGS. 1-8 are exemplary only and do not limit the scope of the invention as defined in the claims.

It is understood that, while the detailed drawings, specific examples, and particular materials given describe a preferred exemplary embodiment of the present invention, they are for the purpose of illustration only. The method and apparatus of the invention is not limited to the precise details and conditions disclosed. For example, although particular shapes of features are described, the circuit board may be configured with other variously shaped features and patterns of solder resist. Although only one motherboard and module system is mentioned, the method and apparatus may be utilized with any contact area or finger connector or any type of circuit board. Also, various configurations for the finger connectors may be utilized. Various changes may be made to the details disclosed without departing from the spirit of the invention which is defined by the following claims.

What is claimed is:

1. A contact area for a circuit board, the contact area being manufactured according to the following steps:

providing the contact area on a surface of the circuit board;

providing a solder mask over a location including the contact area in a pattern, the pattern covering the location and being configured to prevent solder from adhering to the contact area at the location and yet be removed by a low-impact operation;

soldering electrical devices to the circuit board; and stripping the pattern of solder mask by the low-impact operation.

2. The contact area of claim 1 wherein the low impact operation is a non-contact operation.

3. The contact area of claim 1 wherein the pattern includes features separated by meniscus channels.

4. The contact area of claim 3 wherein the meniscus channels are 2 mils or less apart.

5. The contact area of claim 4 wherein the features have areas less than 25 mils squared.

6. The contact area of claim 5 wherein the features are squares, rectangles, or circles.

7. The contact area of claim 5 wherein the features are lines having a width of less than 2 mils.

8. The contact area of claim 6 wherein the soldering step utilizes a wave of solder wherein the lines are disposed in a direction parallel or perpendicular to the wave of solder.

9. An improved finger connector for a first circuit board, the finger connector interfacing a first circuit board to a second circuit board, the finger connector being improved by applying a solder mask in a pattern at a location over the finger connector, the pattern of the solder mask covering the location and being configured to prevent solder from adhering to the finger connector at the location and be removable from the finger connector without deforming the finger connector by a non-contact operation.

10. The improved finger connector of claim 9 wherein the pattern includes features separated by meniscus channels.

11. The improved finger connector of claim 10 wherein the meniscus channels are less than 2 mils.

12. The improved finger connector of claim 11 wherein the meniscus channels are less than 1 mil.

13. The improved finger connector of claim 12 wherein the features have an area of less than 25 mils. squared.

14. A contact area for a circuit board, the contact area being covered by a solder mask pattern means including a plurality of solder mask features for preventing solder from adhering to the area, the solder mask pattern means being removable by a low-impact technique due to the small surface area associated with the solder mask features.

15. The contact area of claim 14 wherein the solder mask features are separated by meniscus channels, the meniscus channels being narrow enough to prevent attachment of the solder.

16. The contact area of claim 15 wherein the solder mask features are rectangles.

17. The contact are of claim 14 wherein the contact area is a finger connector.

18. The contact area of claim 14 wherein the solder mask features are circular, diamond shaped, square shaped, rectangular or star shaped.

19. The contact area of claim 18 wherein the small area is less than 25 mils squared.

20. The contact area of claim 15 wherein the meniscus channels are less than 2 mils wide.

* * * * *